(12) United States Patent
Chou et al.

(10) Patent No.: US 9,444,665 B2
(45) Date of Patent: Sep. 13, 2016

(54) SIGNAL PROCESSING SYSTEM AND SIGNAL PROCESSING METHOD COOPERATING WITH VARIABLE GAIN AMPLIFIER

(71) Applicant: MStar Semiconductor, Inc., Hsinchu Hsien (TW)

(72) Inventors: Yu-Jen Chou, Hsinchu (TW); Chun-Chieh Wang, Hsinchu (TW); Tai-Lai Tung, Hsinchu (TW)

(73) Assignee: MSTAR SEMICONDUCTOR, INC., Hsinchu Hsien (TW)

( * ) Notice: Subject to any disclaimer, the term of this patent is extended or adjusted under 35 U.S.C. 154(b) by 90 days.

(21) Appl. No.: 14/725,678

(22) Filed: May 29, 2015

(65) Prior Publication Data
US 2015/0358187 A1   Dec. 10, 2015

(30) Foreign Application Priority Data

Jun. 10, 2014 (TW) .............................. 103120004 A

(51) Int. Cl.
| | |
|---|---|
| H04L 27/28 | (2006.01) |
| H04K 1/02 | (2006.01) |
| G06K 9/00 | (2006.01) |
| H04L 27/08 | (2006.01) |
| H03F 3/04 | (2006.01) |
| H04L 1/00 | (2006.01) |
| H03G 3/30 | (2006.01) |

(52) U.S. Cl.
CPC ............... *H04L 27/08* (2013.01); *H03F 3/04* (2013.01); *H03G 3/3052* (2013.01); *H04L 1/004* (2013.01); *H03F 2200/294* (2013.01)

(58) Field of Classification Search
CPC . H04L 27/06; H04L 27/04; H04L 25/03343; H04L 25/028; H04L 27/3863; H04L 43/50
USPC .................. 375/260, 297; 382/104
See application file for complete search history.

(56) References Cited

U.S. PATENT DOCUMENTS

| | | | | | |
|---|---|---|---|---|---|
| 5,742,642 | A | * | 4/1998 | Fertner | H04L 25/03057 375/233 |
| 6,137,847 | A | * | 10/2000 | Stott | H04L 1/004 348/E5.003 |
| 6,421,443 | B1 | * | 7/2002 | Moore | G06J 1/00 379/390.01 |
| 7,391,368 | B1 | * | 6/2008 | Gao | G01S 5/0215 342/387 |
| 8,208,213 | B2 | * | 6/2012 | Liu | G11B 20/10009 360/39 |
| 2003/0048430 | A1 | * | 3/2003 | Morcom | G01S 17/32 356/5.01 |
| 2003/0156658 | A1 | * | 8/2003 | Dartois | H03F 1/3294 375/297 |
| 2004/0001563 | A1 | * | 1/2004 | Scarpa | H04L 27/2675 375/326 |
| 2004/0151345 | A1 | * | 8/2004 | Morcom | G01S 7/487 382/104 |
| 2006/0062316 | A1 | * | 3/2006 | Kim | H04H 40/27 375/260 |

FOREIGN PATENT DOCUMENTS

TW   200703929   1/2007

OTHER PUBLICATIONS

Taiwan Intellectual Property Office, Office Action issued Nov. 27, 2015.

* cited by examiner

*Primary Examiner* — Chieh M Fan
*Assistant Examiner* — Sarah Hassan
(74) *Attorney, Agent, or Firm* — WPAT, PC; Justin King

(57) ABSTRACT

A signal processing system includes a variable gain amplifier, an analog-to-digital converter (ADC), a gain compensation module and a signal processing module. The variable gain amplifier applies a variable gain to an analog input signal to generate an amplified analog signal. The ADC converts the amplified analog signal to an amplified digital signal. The gain compensation module applies a compensation gain to the amplified digital signal to generate a compensated signal. The compensated signal has an instantaneous change lower than a predetermined threshold. The signal processing module performs a signal processing procedure on the compensated signal.

14 Claims, 5 Drawing Sheets

SIGNAL PROCESSING SYSTEM AND SIGNAL PROCESSING METHOD COOPERATING WITH VARIABLE GAIN AMPLIFIER

This application claims the benefit of Taiwan application Serial No. 103120004, filed Jun. 10, 2014, the subject matter of which is incorporated herein by reference.

BACKGROUND OF THE INVENTION

1. Field of the Invention

The invention relates in general to a variable gain amplifier, and more particularly to solving an issue caused by an instantaneous change of a gain provided by a variable gain amplifier.

2. Description of the Related Art

Digital television broadcasting has gradually matured with the progressing communication technologies. Digital Video Broadcasting (DVB) specifications are one of the most common standards in the technology field. Based on differences in transmission media and signal types, DVB is further categorized into sub-standards including Digital Video Broadcasting-Cable (DVB-C), Digital Video Broadcasting-Satellite (DVB-S), and Digital Video Broadcasting-Terrestrial (DVB-T).

FIG. 1 shows a partial circuit block diagram of a DVB-C receiving end. A radio-frequency (RF) signal entering this receiving system is amplified by a low-noise amplifier (LNA) 11. An output signal from the LNA 11 is provided to an analog-to-digital converter (ADC) 12 and a filter 14. An automatic gain control (AGC) circuit 13 selectively adjusts a gain that the LNA 11 applies to the RF signal according to the output signal of the ADC 12. A programmable gain amplifier 15 performs an amplification process to the output signal of the filter 14 after receiving the output signal. Similarly, the AGC circuit 17 selectively adjusts a gain that the programmable gain amplifier 15 applies according to the output signal of the ADC 16. Through adjusting the gain with the above feedback mechanism, the amplitude of the signal entering the ADC 16 is adjusted to satisfy a dynamic range of an input signal of the ADC 16. The digital signal generated by the ADC 16 is provided to a digital baseband circuit 18.

In a DVB-C receiving system, the variable range of the gain provided by the LNA 11 is −18 dB to 24 dB, with a smallest unit change being 6 dB. The variable range of the gain provided by the programmable gain amplifier 15 is −5 dB to 22 dB, with a smallest unit change being 3 dB. It is experimentally proven that, when the gain provided by the LNA 11 and/or the programmable gain amplifier 15 changes, and a gain change greater than 0.25 dB is accordingly instantaneously applied to the amplitude of the input signal of the digital baseband circuit 18, an error may be caused in the signal processing result of digital baseband circuit 18.

In addition to the above DVB-C receiving system, other signal processing systems with similar circuit architecture may also encounter the same issue.

SUMMARY OF THE INVENTION

The invention is directed to a signal processing system and a signal processing method. By providing a compensation gain to an output signal of an amplifier, an instantaneous change in the amplitude of a signal transmitted to a digital baseband circuit may be lower than a predetermined threshold, so as to prevent the digital baseband circuit from an increased error rate caused by a large instantaneous change. The concept of the present invention is applicable to DVB-C receiving systems as well as other signal processing systems with similar circuit architecture.

A signal processing system is provided according to an embodiment of the present invention. The signal processing system includes a variable gain amplifier, an analog-to-digital converter (ADC), a gain compensation module and a signal processing module. The variable gain amplifier applies a variable gain to an analog input signal to generate an amplified analog signal. The ADC converts the amplified analog signal to an amplified digital signal. The gain compensation module applies a compensation gain to the amplified digital signal to generate a compensated signal. The compensated signal has an instantaneous change lower than a predetermined threshold. The signal processing module performs a signal processing procedure on the compensated signal.

A signal processing system is provided according to another embodiment of the present invention. A variable gain is applied to an analog input signal to generate an amplified analog signal. The amplified analog signal is converted to an amplified digital signal. A compensation gain is applied to the amplified digital signal to generate a compensated signal. The compensated signal has an instantaneous change lower than a predetermined threshold A signal processing procedure is then performed on the compensated signal.

The above and other aspects of the invention will become better understood with regard to the following detailed description of the preferred but non-limiting embodiments. The following description is made with reference to the accompanying drawings.

DETAILED DESCRIPTION OF THE INVENTION

Figure 1:
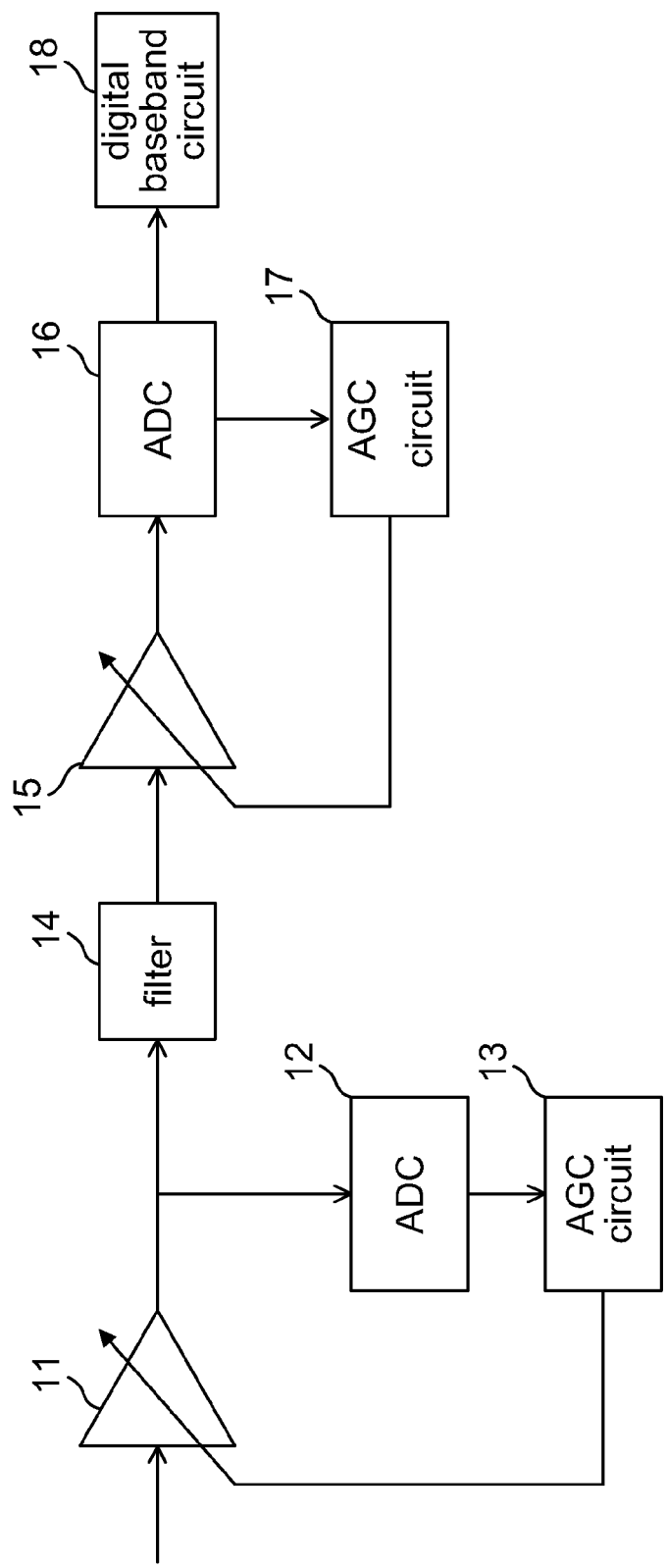
FIG. 1 is a partial circuit block diagram of a DVB-C receiving end.
Figure 2:
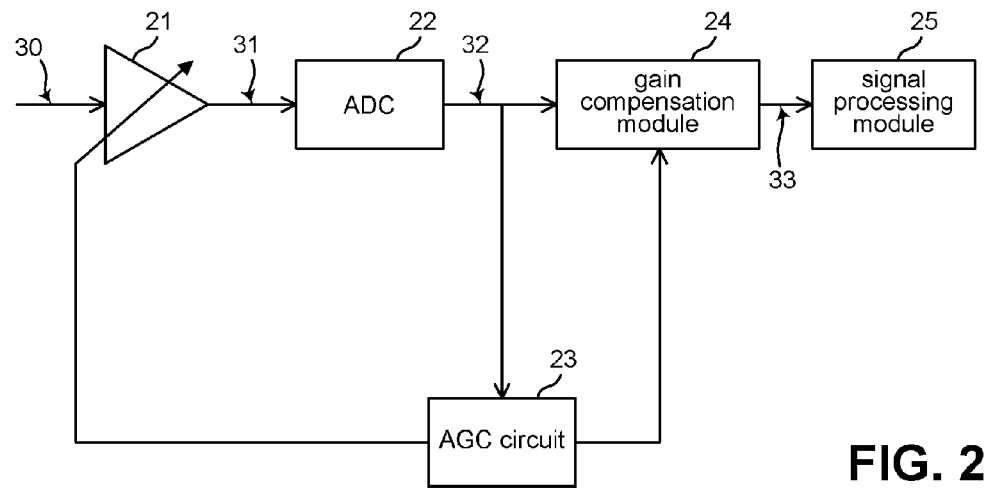
FIG. 2 is a functional block diagram of a signal processing system according to an embodiment of the present invention.

FIG. 2 shows a functional block diagram of a signal processing system according to an embodiment of the present invention. A signal processing system 200 includes a variable gain amplifier 21, an analog-to-digital converter (ADC) 22, an automatic gain control (AGC) circuit 23, a gain compensation module 24 and a signal processing module 25. In practice, for example, the signal processing system 200 may be a Digital Video Broadcasting-Cable (DVB-C) receiving system or a Digital Video Broadcasting-Satellite (DVB-S) receiving system. In practice, the variable gain amplifier 21 may be a low-noise amplifier (LNA) or a programmable gain amplifier. Further, the variable gain amplifier 21 may be one single amplifier, or may include a plurality of amplifier circuits connected in series.

The variable gain amplifier 21 is controlled by the AGC circuit 23 to apply a variable gain $G_V$ to an analog signal 30 to generate an amplified analog signal 31. As shown in FIG. 2, the amplified analog signal 31 is provided to the ADC 22. The amplitude of the analog input signal 30 provided to the signal processing system 200 is not a constant value, and may change with time. One effect of the ADC 22 is to provide a value to the AGC 23 to indicate the approximate amplitude of the amplified analog signal 31. According to an output signal of the ADC 22, the AGC circuit 23 determines whether to adjust the gain $G_V$ that the variable gain amplifier 21 applies to the analog input signal 30, so that the amplitude of the amplified analog signal 31 may substantially satisfy the input dynamic range of the ADC 22. It should be noted that, implementation details of automatic gain control and analog-to-digital conversion are known to one person skilled in the art, and shall be omitted herein.

The ADC 22 converts the amplified analog signal 31 to an amplified digital signal 32. When the AGC circuit 23 changes the variable gain $G_V$ of the variable gain amplifier 21, associated information of the change is provided to the gain compensation module 24. In one embodiment, when the variable gain amplifier 21 adjusts the variable gain $G_V$ from a first gain value to a second gain value, the information that the AGC circuit 23 provides to the gain compensation module 24 is the values of the first gain value and the second gain value. In another embodiment, the information that the AGC circuit 23 provides to the gain compensation module 24 is the value of one of the gain values and a difference between the two.

According to the information provided by the AGC circuit 23, the gain compensation module 24 applies a compensation gain $G_C$ to the amplified digital signal 32 to generate a compensated signal 33. The gain compensation module 24 is designed to cause the compensated signal to have an instantaneous change lower than a predetermined threshold. Associated details are given below.

Figure 3A:
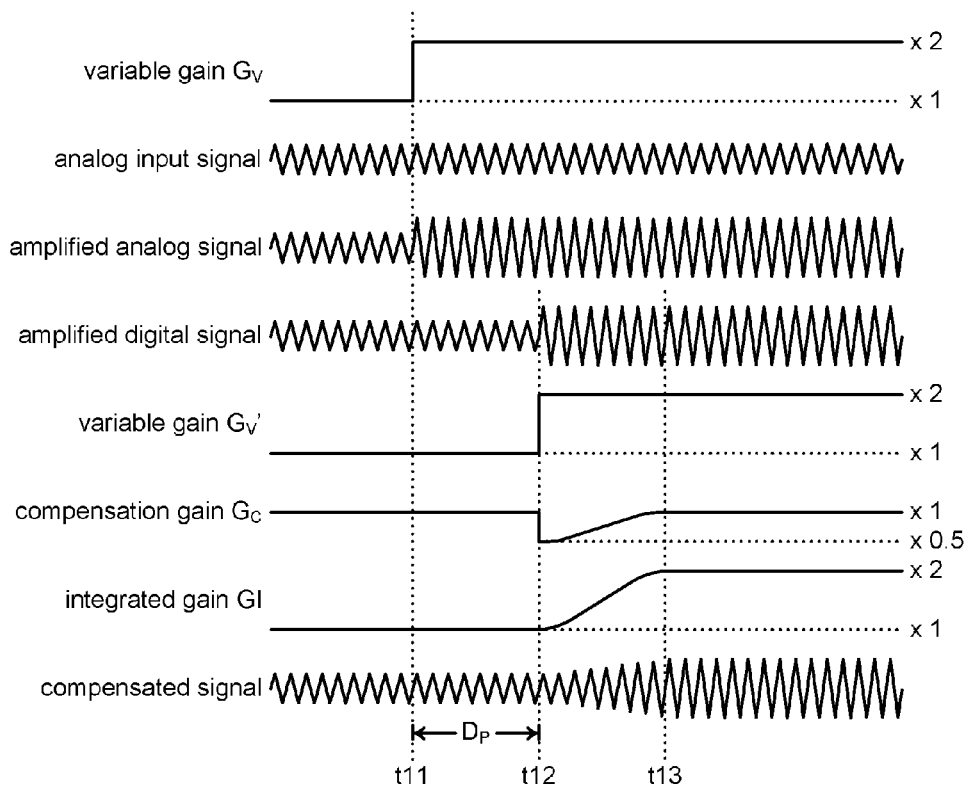
FIG. 3(A) and FIG. 3(B) are two examples of timing relations of a variable gain $G_V$, a compensation gain $G_C$, an integrated gain $G_I$ and several signals of the present invention.

FIG. 3(A) shows an example of timing relations of the variable gain $G_V$, the compensation gain $G_C$, the integrated gain $G_I$ and several signals. For illustration purposes, waveforms of the amplified digital signal 32 and the compensated signal 33 are represented in an analog signal form. In the example, the variable gain $G_V$ is increased to an order of two times (×2) from one times (×1) at a time point t11. Thus, the amplitude of the amplified analog signal 31 becomes twice of an original value from the time point t11. Due to a propagation delay $D_P$ contributed by the ADC 22, the amplitude of the amplified digital signal 32 only becomes twice of an original value at the time point t12. The amplified digital signal 32 may also be regarded as receiving the effect of the variable gain $G_V$ only starting from the time point t12. In FIG. 3(A), a variable gain $G_V'$ represents an equivalent gain that the variable gain $G_V$ forms for the amplified digital signal 32. That is, the integrated gain $G_I$ formed for the amplified signal 32 may be a product of the variable gain $G_V'$ and the compensation gain $G_C$. In practice, the length of the propagation delay $D_P$ is known through measurement and estimation in advance, and the AGC circuit 23 may inform the gain compensation module 24 of the time point t11. Thus, the gain compensation module 24 may learn the position of the time point t12, and set the time point t12 as a compensation starting time. In the example, the gain compensation module 24 determines the compensation gain $G_C$. Before the point t12, the compensation gain $G_C$ is one times (×1), and at the time point t12, the compensation gain $G_C$ is reduced to 0.5 times (×0.5). Therefore, the integrated gain $G_I$ before and after the time point t12 is substantially one times (×1). As shown in FIG. 3(A), from the time point t12, the gain compensation module 24 gradually increases the compensation gain $G_C$ to cause the integrated gain $G_I$ to gradually approximate two times (×2), i.e., the second gain value. At a time point t13, the integrated gain $G_I$ reaches two times (×2), and the compensation gain $G_C$ at this time point is substantially raised to one times (×1).

The change in the variable gain $G_V$ is known to the gain compensation module 24. On the other hand, the amplitude of change in the compensation gain $G_C$ can be controlled by the gain compensation module 24. By appropriately controlling the compensation gain $G_C$, the integrated gain $G_I$ formed by the compensation gain $G_C$ and the variable gain $G_V$ for the amplified digital signal 32 may be maintained not to have an instantaneous change greater than a predetermined threshold (e.g., 0.25 dB). As seen from FIG. 3(A), different from the amplified digital signal 32 having a large instantaneous change at the time point t12, the amplitude of the compensated signal 33 after the time point t12 progressively increases by a small margin. After the time point t13, the compensated signal 33 and the amplified digital signal 32 are almost a same signal with a same signal level.

Next, the signal processing module 25 receives the compensated signal 33, and performs a signal processing procedure on the compensated signal 33, e.g., a demodulation procedure. As the change in the variable gain $G_V$ within a short period does not cause a large instantaneous change in the amplitude of the compensated signal 33, the resultant increased error rate of the signal processing module 25 can be effectively prevented. In practice, the predetermined threshold may be determined according to the signal instantaneous change tolerable to the signal processing module 25, and is not limited to a specific value. Further, one person skilled in the art can understand that, instead of the example depicted in FIG. 3(A), the pattern of the change in the compensation gain $G_C$ may be a linear or nonlinear curve. It should be noted that, the position of the time point t13 may be associated with the amplitude changes of the variable gain $G_V$ and the compensation gain $G_C$. When the gain compensation module 24 adopts another compensation gain $G_C$ change pattern, the position of the time point t13 may be different. Assume that the variable gain amplifier 21 adjusts the variable gain $G_V$ from a first gain value to a second gain value. In practice, the gain compensation module 24 may cause the product of the second gain value and the compensation gain $G_C$ at the compensation starting time point t12 to be substantially equal to the product of the first gain value and the compensation gain $G_C$ before the compensation starting time point t12. Starting from the compensation starting time t12, the integrated gain $G_I$ gradually approximates the second gain value.

Figure 3B:
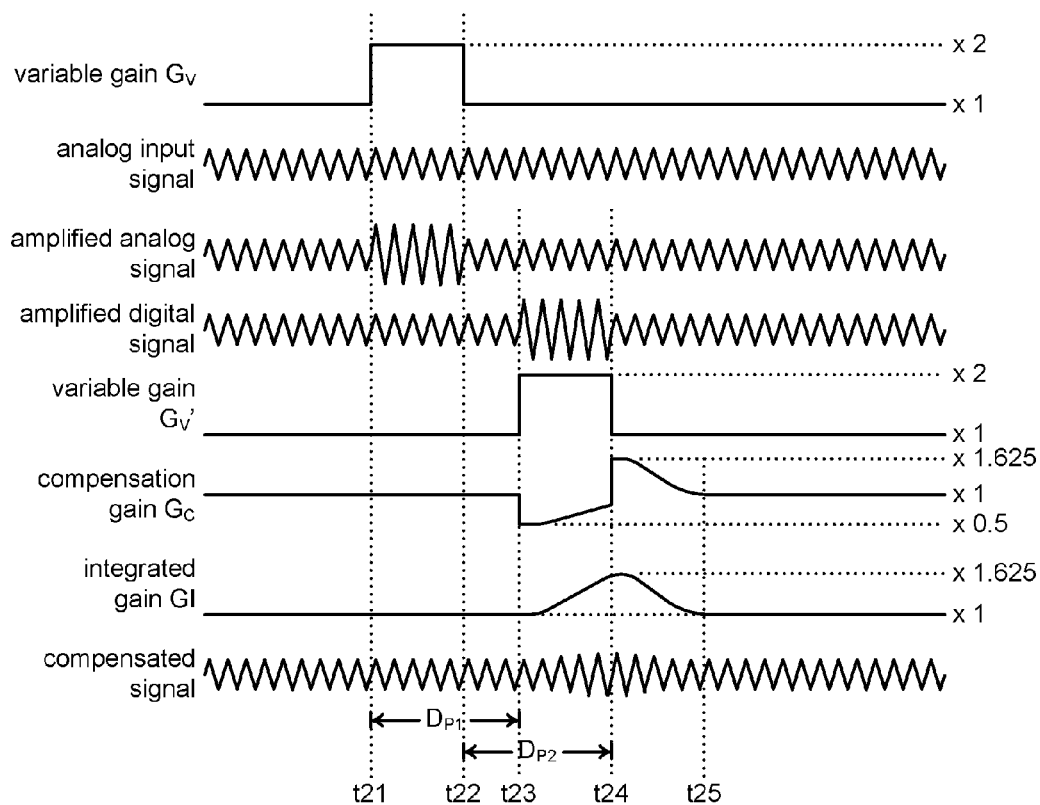

FIG. 3(B) shows another example of timing relations of the variable gain $G_V$, the compensation gain $G_C$, the integrated gain $G_I$ and several signals. In the example, the variable gain $G_V$ changes from one times to two times at a time point t21, and is then adjusted back to one times from two times at a time point t22. As shown in FIG. 3(B), due to the signal propagation delays ($D_{P1}$ and $D_{P2}$) contributed by the ADC 24, the equivalent variable gain $G_V'$ for the amplified digital signal 32 starts to change at time points t23 and t24. Starting from the time point t23, the gain compensation module 24 starts to provide a progressively increasing compensation gain $G_C$. The equivalent variable gain $G_V'$ reduces from two times to one times at the time point t24, and so the gain compensation module 24, after the time point t24, does not cause the compensation gain $G_C$ to continue rising to approximate 1 times. In the example, it is assumed that, after the gradual rise from the time point t23 to the time point t24, the compensation gain $G_C$ at the time point t24 is increased from the original 0.5 times to be substantially equal to 0.8125 times. To compensate the decrease in the equivalent variable gain $G_V'$ at the time point t24, the gain compensation module 24 instantaneously increases the compensation gain $G_C$ to 1.625 times (0.8125×2) at the time point t24, and causes the compensation gain $G_C$ to start gradually decreasing from the time point t24. As shown in FIG. 3(B), such approach renders the integrated gain $G_I$ to start gradually decreasing from the time point t24. Similarly, the gain compensation gain module 24 sets the compensation gain $G_C$ in a way that the integrated gain $G_I$ formed for the amplified digital signal 32 does not have an instantaneous change greater than the predetermined threshold.

Figure 4:
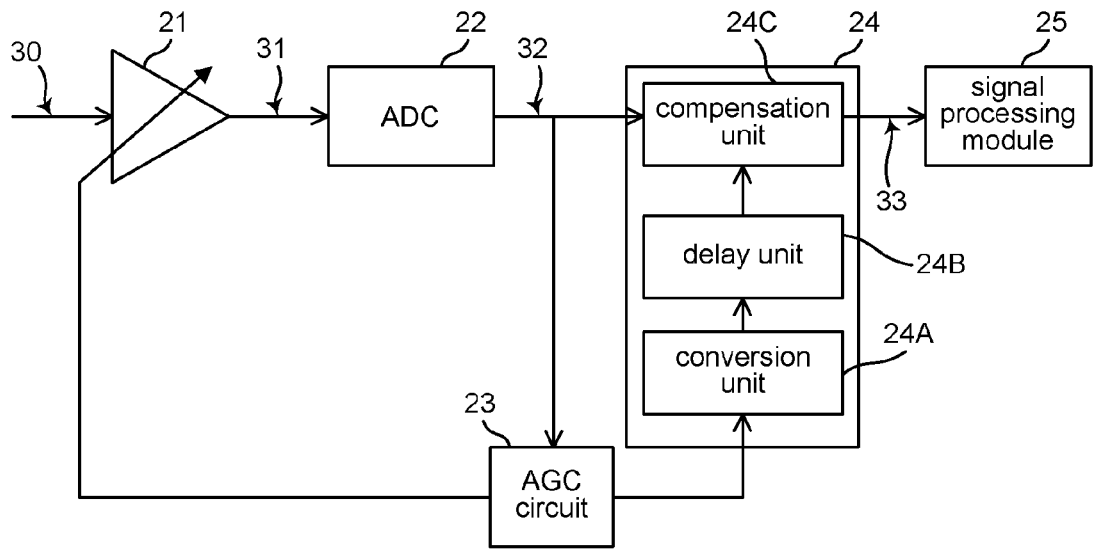
FIG. 4 is a detailed example of a gain compensation module of the present invention.

In practice, the gain compensation module 24 may be implemented as a fixed and/or programmable digital logic circuit, and may include a programmable logic gate array, an application-specific integrated circuit, a microcontroller, a microprocessor, a digital signal processor and other necessary circuits. FIG. 4 shows a detailed example of the gain compensation module 24. In the embodiment, the gain compensation module 24 includes a conversion unit 24A, a delay unit 24B and a gain compensation unit 24C. The conversion unit 24A receives an initial difference, in a unit of decibels (dB), between the first gain value and the second gain value from the AGC circuit 23, and accordingly generates a converted difference in a unit of linear multiples for the gain compensation unit 24C to determine the compensation gain $G_C$ (may be implemented by a calculation circuit or an look-up table). It should be noted that, when the information that the AGC circuit 23 provides to the gain compensation module 24 is already in a unit of linear multiples, the conversion unit 24A may be omitted. According to the signal propagation delay between the variable gain amplifier 21 and the gain compensation unit 24C, the delay unit 24B provides a delay corresponding to the foregoing compensation starting time point. In one embodiment, the amount of delay provided by the delay unit 24B is designed as programmable to adapt to propagation delay variances that may be caused by element characteristics or manufacturing differences. It should be noted that, other circuits (e.g., a filter) may be additionally disposed between the variable gain amplifier 21 and the gain compensation unit 24C. The gain compensation unit 24C generates the compensation gain $G_C$, and applies the compensation gain $G_C$ to the amplified digital signal 32.

Figure 5:
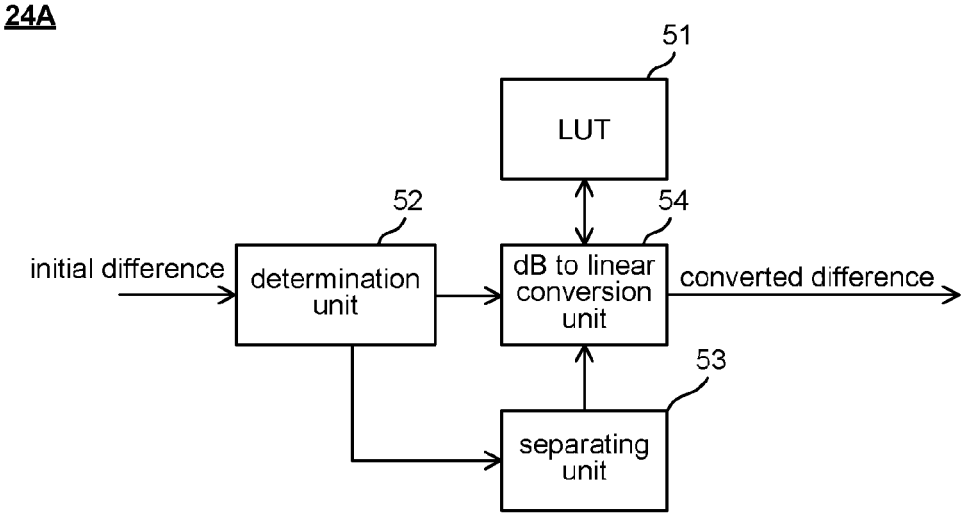
FIG. 5 is a detailed example of a conversion unit of the present invention.

FIG. 5 shows a detailed example of the conversion unit 24A. In this example, the conversion unit 24A includes a look-up table (LUT) 51, a determination unit 52, a separating unit 53 and a dB to linear conversion unit 54. The LUT 51 stores a plurality of conversion relations corresponding to a predetermined range. For example, the predetermined range may be −6 dB to +6 dB, and the LUT 51 stores corresponding relations of decibel values in a unit difference of 0.1 dB and linear multiples. The determination unit 52 determines whether the initial difference in a unit of decibels falls in the predetermined range. When the determination result of the determination unit 52 is affirmative, the dB to linear conversion unit 54 directly identifies the linear multiple corresponding to the initial difference from the LUT 51 by using the initial difference as an index value, and utilizes the identified linear multiple as an output result of the conversion unit 24A. When the determination result of the determination unit 52 is negative, the separating unit 53 separates a first part of the initial difference outside the predetermined range from a second part within the predetermined range. For example, when the predetermined range is −6 dB to +6 dB and the initial difference is +9 dB, the separating unit 53 may separate +9 dB as a first part outside the predetermined range (+6 dB) and a second part within the predetermined range (+3 dB). The dB to linear conversion unit 54 then calculates a first vale (+6 dB=two times) according to the first part, identifies a second value corresponding to the second part (+3 dB), and combines (through multiplication) the first value and the second value to the converted difference. One advantage of the conversion unit 24A is that, by separating a part of the value that can be easily calculated (e.g., an integral multiple of 6 dB), the data amount of the contents in the LUT 51 can be reduced.

In the scope of the present invention, the signal processing system 200 is not limited to be implemented by a specific configuration or architecture. One person skilled in the art can understand that, without departing from the spirit of the present invention, there are many other circuit configurations and elements for realizing the concept of the present invention.

Figure 6:
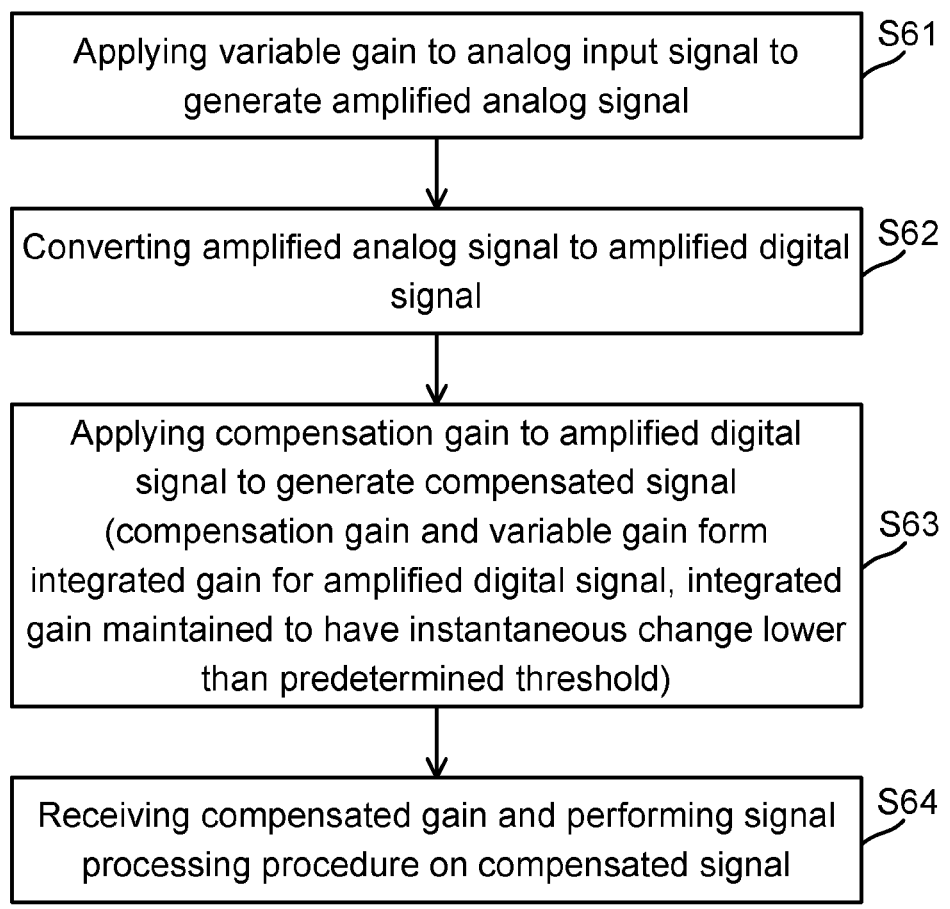
FIG. 6 is a flowchart of a signal processing method according to an embodiment of the present invention.

FIG. 6 shows a flowchart of a signal processing method according to an embodiment of the present invention. In step S61, a variable gain is applied to an analog input signal to generate an amplified analog signal. In step S62, the amplified analog signal is converted to an amplified digital signal. In step S63, a compensation gain is applied to the amplified digital signal to generate a compensated signal. The compensation gain and the variable gain form an integrated gain for the amplified digital signal in a way that the integrated gain is maintained to have an instantaneous change lower than a predetermined threshold. In step S64, the compensated signal is received, and a signal processing procedure is performed on the compensated signal.

One person skilled in the art can understand that, operation variations in the description associated with the system processing system 200 are applicable to the signal processing method in FIG. 6, and such repetitive details shall be omitted herein.

In conclusion, a signal processing system and a signal processing method are provided by the present invention. By providing a compensation gain to an output signal of an amplifier, an instantaneous change in the amplitude of a signal transmitted to a digital baseband circuit may be effectively reduced or even eliminated, thereby preventing the digital baseband circuit from an increased error rate caused by a large instantaneous change. The concept of the present invention is applicable to DVB-C receiving systems as well as other signal processing systems with similar circuit architecture.

While the invention has been described by way of example and in terms of the preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A signal processing system, comprising:
   a variable gain amplifier, configured to apply a variable gain to an analog input signal to generate an amplified analog signal;
   an analog-to-digital converter (ADC), configured to convert the amplified analog signal to an amplified digital signal;

a gain compensation circuit, configured to apply a compensation gain to the amplified digital signal to generate a compensated signal, wherein the compensated signal has an instantaneous change lower than a predetermined threshold, and the gain compensation circuit further comprises a conversion circuit, configured to receive an initial difference, in a unit of decibels, between a first gain value and a second gain value, and to accordingly generate a converted difference in a unit of linear multiples for the gain compensation module to determine the compensation gain; and a signal processing circuit, configured to perform a signal processing procedure on the compensated signal.

2. The signal processing system according to claim 1, wherein when the variable gain amplifier adjusts the variable gain from the first gain value to the second gain value, the gain compensation circuit sets a compensation starting time point, generates the compensation gain to cause a product of the second gain value and the compensation gain to be substantially equal to the first gain value at the compensation starting time point, and gradually adjusts the compensation gain to cause the product of the second gain value and the compensation gain to be substantially equal to the second gain value.

3. The signal processing system according to claim 2, wherein the gain compensation circuit comprises:
a delay circuit, configured to provide a delay corresponding to the compensation starting time point according to a signal propagation delay between the variable gain amplifier and the gain compensation module.

4. The signal processing system according to claim 1, wherein the conversion circuit comprises:
a look-up table (LUT), storing a plurality of conversion relations corresponding to the initial difference and the converted difference; and
a second conversion circuit, configured to identify the converted difference from the LUT according to the initial difference.

5. The signal processing system according to claim 1, wherein the conversion unit comprises:
an LUT, storing a plurality of conversion relations corresponding to a predetermined range;
a determination circuit, configured to determine whether the initial difference falls within the predetermined range;
a separating circuit, configured to separate the initial difference to a first part outside the predetermined range and a second part within the predetermined range when a determination result of the determination unit is negative; and
a dB to linear conversion circuit, configured to calculate a first value according to the first part, to identify a second value corresponding to the second part from the LUT, and to combine the first value and the second value to the converted difference through multiplication.

6. The signal processing system according to claim 1, wherein the variable gain amplifier is one of a low-noise amplifier and a programmable gain amplifier.

7. The system processing system according to claim 1, wherein the variable gain amplifier comprises a plurality of amplifier circuits connected in series.

8. The signal processing system according to claim 1, wherein the signal processing procedure is a demodulation procedure.

9. A signal processing method, comprising:
a) applying a variable gain to an analog input signal to generate an amplified analog signal;
b) converting the amplified analog signal to an amplified digital signal;
c) applying a compensation gain to the amplified digital signal to generate a compensated signal, wherein the compensated signal has an instantaneous change lower than a predetermined threshold, wherein the compensation gain is determined by:
receiving an initial difference, in a unit of decibels, between a first gain value and a second gain value, and accordingly generating a converted difference in a unit of linear multiples; and
determining the compensation gain according to the converted difference; and
d) performing a signal processing procedure on the compensated signal.

10. The signal processing method according to claim 9, when the variable gain is adjusted from the first gain value to the second gain value, wherein step (c) comprises:
(c1) setting a compensation starting time point;
(c2) generating the compensation gain to cause a product of the second gain value and the compensation gain to be substantially equal to the first gain value at the compensation starting time point; and
(c3) gradually adjusting the compensation gain to cause the product of the second gain value and the compensation gain substantially to be equal to the second gain value.

11. The signal processing method according to claim 10, wherein the compensation starting time point is determined by a propagation delay between step (a) and step (c).

12. The signal processing method according to claim 9, wherein step (c1) comprises
identifying the converted difference from an LUT according to the initial difference, wherein the LUT stores a plurality of conversion relations corresponding to the initial difference and the converted difference.

13. The signal processing method according to claim 9, wherein step (c) comprises:
c1) determining whether the initial difference falls within the predetermined range;
c2) when a determination result of step (c1) is negative, separating the initial difference to a first part outside the predetermined range and a second part within the predetermined range;
c3) calculating a first value according to the first part;
c4) identifying a second value corresponding to the second part from an LUT, wherein the LUT for storing a plurality of conversion relations corresponding to the initial difference and the converted difference; and
c5) combining the first value and the second value to the converted difference through multiplication.

14. The signal processing method according to claim 9, wherein the signal processing procedure is a demodulation procedure.

* * * * *